(12) United States Patent
Krah

(10) Patent No.: US 7,986,313 B2
(45) Date of Patent: Jul. 26, 2011

(54) ANALOG BOUNDARY SCANNING BASED ON STRAY CAPACITANCE

(75) Inventor: Christoph Horst Krah, Los Altos, CA (US)

(73) Assignee: Apple Inc., Cupertino, CA (US)

( * ) Notice: Subject to any disclaimer, the term of this patent is extended or adjusted under 35 U.S.C. 154(b) by 1194 days.

(21) Appl. No.: 11/650,511

(22) Filed: Jan. 3, 2007

(65) Prior Publication Data

US 2008/0157782 A1 Jul. 3, 2008

(51) Int. Cl.
G06F 3/038 (2006.01)

(52) U.S. Cl. ..... 345/204; 345/173; 345/179; 178/18.01; 714/27

(58) Field of Classification Search .......... 345/173–179, 345/204; 178/18.01–18.06; 714/27
See application file for complete search history.

(56) References Cited

U.S. PATENT DOCUMENTS

| | | | |
|---|---|---|---|
| 4,550,221 A | 10/1985 | Mabusth | |
| 5,483,261 A | 1/1996 | Yasutake | |
| 5,488,204 A | 1/1996 | Mead et al. | |
| 5,543,590 A | 8/1996 | Gillespie et al. | |
| 5,544,174 A * | 8/1996 | Abend | 714/726 |
| 5,825,352 A | 10/1998 | Bisset et al. | |
| 5,835,079 A | 11/1998 | Shieh | |
| 5,880,411 A | 3/1999 | Gillespie et al. | |
| 6,188,391 B1 | 2/2001 | Seely et al. | |
| 6,310,610 B1 | 10/2001 | Beaton et al. | |
| 6,323,846 B1 | 11/2001 | Westerman et al. | |
| 6,339,388 B1 * | 1/2002 | Matsumoto | 341/120 |
| 6,690,387 B2 | 2/2004 | Zimmerman et al. | |
| 6,694,464 B1 * | 2/2004 | Quayle et al. | 714/725 |
| 7,015,894 B2 | 3/2006 | Morohoshi | |
| 7,102,555 B2 * | 9/2006 | Collins et al. | 341/120 |
| 7,184,064 B2 | 2/2007 | Zimmerman et al. | |
| 7,663,607 B2 | 2/2010 | Hotelling et al. | |
| 2004/0068675 A1 * | 4/2004 | Liu | 714/27 |
| 2006/0026521 A1 | 2/2006 | Hotelling et al. | |
| 2006/0097991 A1 | 5/2006 | Hotelling et al. | |
| 2006/0197753 A1 | 9/2006 | Hotelling | |
| 2006/0207806 A1 * | 9/2006 | Philipp | 178/18.05 |

(Continued)

FOREIGN PATENT DOCUMENTS

| | | |
|---|---|---|
| JP | 2000-163031 A | 6/2000 |
| JP | 2002-342033 A | 11/2002 |

OTHER PUBLICATIONS

Lee, S.K. et al. (Apr. 1985). "A Multi-Touch Three Dimensional Touch-Sensitive Tablet," *Proceedings of CHI: ACM Conference on Human Factors in Computing Systems*, pp. 21-25.

(Continued)

*Primary Examiner* — Kimnhung Nguyen
(74) *Attorney, Agent, or Firm* — Morrison & Foerster LLP

(57) ABSTRACT

Embodiments of the present invention are directed to performing boundary scanning without using a pin which is exclusively dedicated for that purpose. The boundary scan can be performed by an integrated circuit by utilizing a pin which has an alternative use during ordinary operation of the integrated circuit and the device. This pin can be connected to an analog circuit configured to sense capacitance outside of the pin. The analog circuit may also have an alternative function in normal operation of the device. During a testing mode, the analog circuit can sense a stray capacitance present at the pin. The sensed capacitance can be compared to one or more stored expected capacitance values to determine an interconnection state of the system.

50 Claims, 10 Drawing Sheets

U.S. PATENT DOCUMENTS

| | | | |
|---|---|---|---|
| 2007/0028143 A1* | 2/2007 | Azimi et al. | 714/27 |
| 2007/0109286 A1* | 5/2007 | Nakamura et al. | 345/204 |
| 2008/0006453 A1* | 1/2008 | Hotelling | 178/18.06 |
| 2008/0150905 A1* | 6/2008 | Grivna et al. | 345/173 |
| 2008/0162996 A1 | 7/2008 | Krah et al. | |

OTHER PUBLICATIONS

Rubine, D.H. (Dec. 1991). "The Automatic Recognition of Gestures," CMU-CS-91-202, Submitted in Partial Fulfillment of the Requirements of the Degree of Doctor of Philosophy in Computer Science at Carnegie Mellon University, 285 pages.

Rubine, D.H. (May 1992). "Combining Gestures and Direct Manipulation," CHI '92, pp. 659-660.

Westerman, W. (Spring 1999). "Hand Tracking, Finger Identification, and Chordic Manipulation on a Multi-Touch Surface," A Dissertation Submitted to the Faculty of the University of Delaware in Partial Fulfillment of the Requirements for the Degree of Doctor of Philosophy in Electrical Engineering, 364 pages.

* cited by examiner

ANALOG BOUNDARY SCANNING BASED ON STRAY CAPACITANCE

FIELD OF THE INVENTION

This invention relates to self testing in an electronic device, and more particularly, to testing whether various modules are properly interconnected in an electronic device.

BACKGROUND OF THE INVENTION

When digital devices are manufactured, they are usually tested to ensure that there are no errors in manufacture. These tests may be performed immediately after manufacture and before distribution of a digital device or, in some cases, during manufacture of the digital device. Due to the advanced miniaturization of modern electronics, testing of digital devices by external monitoring is relatively difficult. That is, it is not easy to determine by external monitoring whether various components are properly functioning and/or properly connected. Therefore, many of the more complex modern electronic devices include testing circuitry as part of the device. The testing circuitry is used at the time of manufacture to perform various tests and, for some devices, it may never be used again. Alternatively, other devices may provide for testing subsequent to manufacture and distribution, such as during service or repair of the device.

The manufacture of devices with internal test circuitry does present some disadvantages. One is that placing test circuits in every manufactured device can result in higher costs per device (as opposed to using external test equipment where a single piece of equipment can be used to test a large number of manufactured devices). For example, if a device includes an integrated circuit implemented on a chip, one or more of the pins of that chip may be dedicated for test purposes. These pins may test, for example, whether the chip is properly connected to a printed circuit board (PCB), whether other elements of the device are also properly connected to the board, and/or whether the various interconnects within the board itself are intact. This type of testing is referred to as boundary scanning. However, for many devices, each pin on an integrated circuit presents a relatively significant cost. Using a pin merely for test purposes tends to magnify that cost, because this means that the pin will not be used through most of the life of the device.

SUMMARY OF THE INVENTION

Embodiments of the present invention are directed to performing boundary scanning without using a pin exclusively dedicated for that purpose.

The boundary scan can be performed by an integrated circuit by utilizing a pin which has an alternative use during ordinary operation of the integrated circuit and the device. This pin can be connected to an analog circuit configured to sense capacitance outside of the pin. During a testing mode the analog circuit can sense a stray capacitance present at the pin.

Several predefined expected capacitance values or ranges of values may be saved in the integrated circuit. These values may define the expected capacitances at different states of interconnection of the various elements of the device. For example, the values may define the expected capacitances when: (i) the pin is floating (i.e., not attached to anything), (ii) when it is attached to a PCB, but the PCB does not connect the pin to another circuit element, and (iii) when the pin is attached to a PCB, another predefined element is also attached to the PCB and the other element is connected to the pin through the PCB.

During the testing mode, the analog circuit can sense the stray capacitance and compare it to one of the predefined capacitances. Based on this comparison, the integrated circuit can determine the state of interconnections within the device and perform boundary scanning.

An alternative embodiment can use different or additional expected capacitance values to test for additional possible states. For example, an expected capacitance value may be saved which represents a state in which the pin is connected to the PCB, but a line of the PCB which is intended to connect the pin to another element is broken.

In some embodiments the analog circuit used for testing can also be usable (after some reconfiguration) during ordinary operation of the device. For example, in one embodiment, the pin can connect through the PCB to a touch sensitive panel. In this embodiment, the capacitance sensing circuit may also be used for sensing various capacitances at the touch sensitive display, to determine whether various portions are being touched or not. Therefore, the additional circuitry required for boundary scanning may be relatively minor. In another embodiment, the touch sensitive display can be a multi-touch sensitive display or a proximity sensing display.

DETAILED DESCRIPTION OF THE PREFERRED EMBODIMENT

In the following description of preferred embodiments, reference is made to the accompanying drawings which form a part hereof, and in which it is shown by way of illustration specific embodiments in which the invention may be practiced. It is to be understood that other embodiments may be used and structural changes may be made without departing from the scope of the preferred embodiments of the present invention.

Although embodiments of the present invention are described herein in relation to an electronic device having multi-touch panel, it should be understood that the present invention is not limited to such devices, but is generally applicable to any electronic device which may benefit from boundary scanning.

The embodiments of the present invention can be used in variety of settings. One example of such a setting is an electronic device featuring a touch screen which is configured to detect multiple simultaneous touches thereon. A device including such a touch screen is described by FIGS. 1-3 and the accompanying discussion below. As mention above, the present invention is not limited to the device discussed in FIGS. 1-3 but may be used in a variety of different devices.

Figure 1:
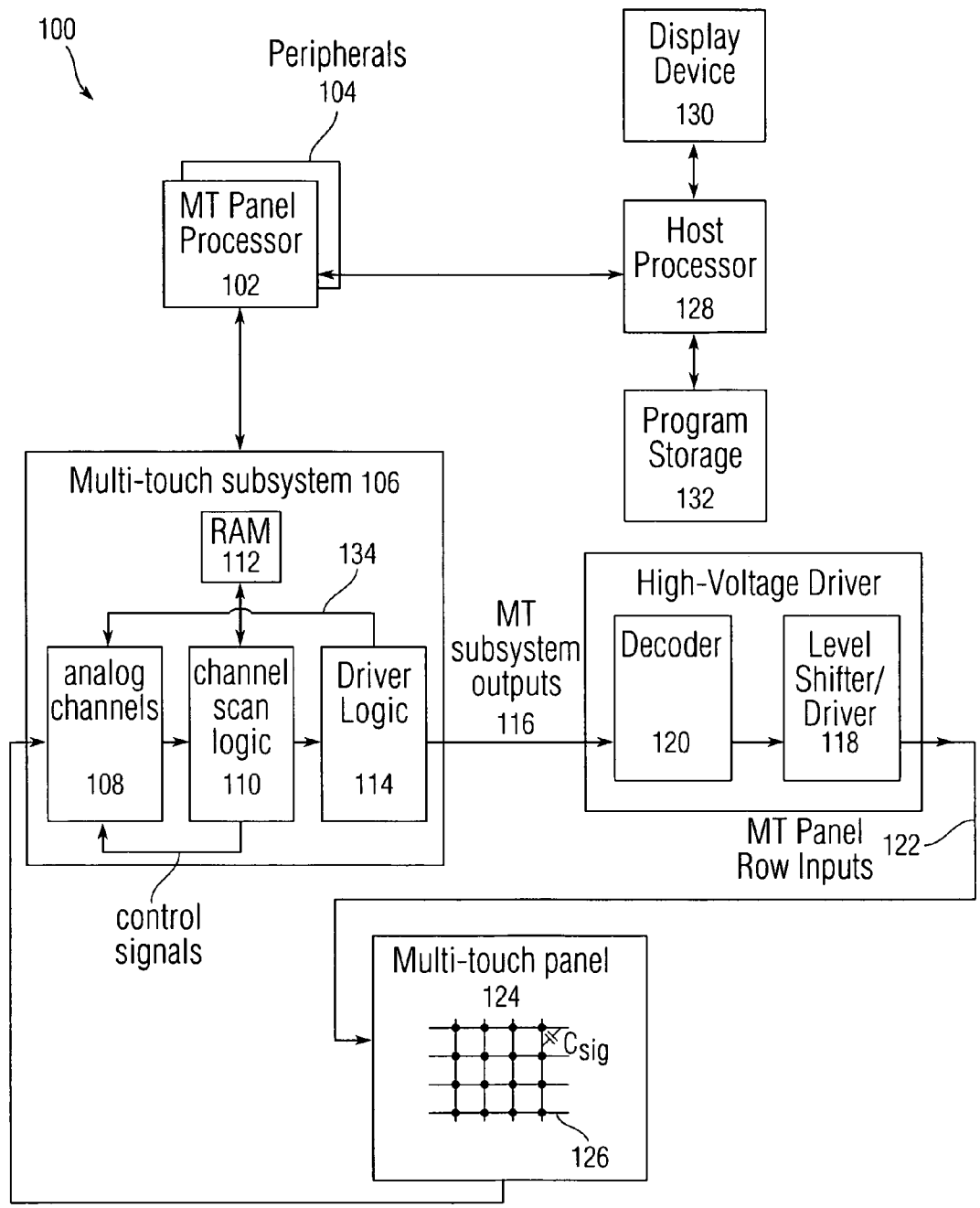
FIG. 1 illustrates an exemplary computing system using a multi-touch panel input device.

Multi-touch touch-sensitive panels according to one embodiment of this invention can detect multiple touches (touch events or contact points) that occur at about the same time (and at different times), and identify and track their locations. FIG. 1 illustrates exemplary computing system 100 that uses multi-touch panel 124. Computing system 100 can include one or more multi-touch panel processors 102 and peripherals 104, and multi-touch subsystem 106. One or more processors 102 can include, for example, ARM968 processors or other processors with similar functionality and capabilities. However, in other embodiments, the multi-touch panel processor functionality can be implemented instead by dedicated logic, such as a state machine. Peripherals 104 may include, but are not limited to, random access memory (RAM) or other types of memory or storage, watchdog timers and the like. Multi-touch subsystem 106 can include, but is not limited to, one or more analog channels 108, channel scan logic 110 and driver logic 114. Channel scan logic 110 can access RAM 112, autonomously read data from the analog channels and provide control for the analog channels. This control can include multiplexing columns of multi-touch panel 124 to analog channels 108. In addition, channel scan logic 110 can control the driver logic and stimulation signals being selectively applied to rows of multi-touch panel 124. In some embodiments, multi-touch subsystem 106, multi-touch panel processor 102 and peripherals 104 can be integrated into a single application specific integrated circuit (ASIC).

Driver logic 114 can provide multiple multi-touch subsystem outputs 116 and can present a proprietary interface that drives high voltage driver, which is comprised of decoder 120 and subsequent level shifter and driver stage 118, although level-shifting functions could be performed before decoder functions. Level shifter and driver 118 can provide level shifting from a low voltage level (e.g. CMOS levels) to a higher voltage level, providing a better signal-to-noise (S/N) ratio for noise reduction purposes. Decoder 120 can decode the drive interface signals to one out of N outputs, whereas N is the maximum number of rows in the panel. Decoder 120 can be used to reduce the number of drive lines needed between the high voltage driver and multi-touch panel 124. Each multi-touch panel row input 122 can drive one or more rows in multi-touch panel 124. In some embodiments, driver 118 and decoder 120 can be integrated into a single ASIC. However, in other embodiments driver 118 and decoder 120 can be integrated into driver logic 114, and in still other embodiments driver 118 and decoder 120 can be eliminated entirely.

Multi-touch panel 124 can in some embodiments include a capacitive sensing medium having a plurality of row traces or driving lines and a plurality of column traces or sensing lines, although other sensing media may also be used. The row and column traces may be formed from a transparent conductive medium, such as Indium Tin Oxide (ITO) or Antimony Tin Oxide (ATO), although other transparent and non-transparent materials, such as copper, can also be used. In some embodiments, the row and column traces can be formed on opposite sides of a dielectric material, and can be perpendicular to each other, although in other embodiments other non-orthogonal orientations are possible. For example, in a polar coordinate system, the sensing lines can be concentric circles and the driving lines can be radially extending lines (or vice versa). It should be understood, therefore, that the terms "row" and "column," "first dimension" and "second dimension," or "first axis" and "second axis" as used herein are intended to encompass not only orthogonal grids, but the intersecting traces of other geometric configurations having first and second dimensions (e.g. the concentric and radial lines of a polar-coordinate arrangement). It should also be noted that in other embodiments, the rows and columns can be formed on a single side of a substrate, or can be formed on two separate substrates separated by a dielectric material. In some embodiments, the dielectric material can be transparent, such as glass, or can be formed from other materials, such as mylar. An additional dielectric cover layer may be placed over the row or column traces to strengthen the structure and protect the entire assembly from damage.

At the "intersections" of the traces, where the traces pass above and below each other (but do not make direct electrical contact with each other), the traces essentially form two electrodes (although more than two traces could intersect as well). Each intersection of row and column traces can represent a capacitive sensing node and can be viewed as picture element (pixel) 126, which can be particularly useful when multi-touch panel 124 is viewed as capturing an "image" of touch. (In other words, after multi-touch subsystem 106 has determined whether a touch event has been detected at each touch sensor in the multi-touch panel, the pattern of touch sensors in the multi-touch panel at which a touch event occurred can be viewed as an "image" of touch (e.g. a pattern of fingers touching the panel).) The capacitance between row and column electrodes appears as a stray capacitance on all columns when the given row is held at DC and as a mutual capacitance Csig when the given row is stimulated with an AC signal. The presence of a finger or other object near or on the multi-touch panel can be detected by measuring changes to Csig. The columns of multi-touch panel 124 can drive one or more analog channels 108 (also referred to herein as event detection and demodulation circuits) in multi-touch subsystem 106. In some embodiments, each column is coupled to one dedicated analog channel 108. However, in other embodiments, the columns may be couplable via an analog switch to a fewer number of analog channels 108.

Computing system 100 can also include host processor 128 for receiving outputs from multi-touch panel processor 102 and performing actions based on the outputs that may include, but are not limited to, moving an object such as a cursor or pointer, scrolling or panning, adjusting control settings, opening a file or document, viewing a menu, making a selection, executing instructions, operating a peripheral device connected to the host device, answering a telephone call, placing a telephone call, terminating a telephone call, changing the volume or audio settings, storing information related to telephone communications such as addresses, frequently dialed numbers, received calls, missed calls, logging onto a computer or a computer network, permitting authorized individuals access to restricted areas of the computer or computer network, loading a user profile associated with a user's preferred arrangement of the computer desktop, permitting access to web content, launching a particular program, encrypting or decoding a message, and/or the like. Host processor 128 may also perform additional functions that may not be related to multi-touch panel processing, and can be coupled to program storage 132 and display device 130 such as an LCD display for providing a user interface (UI) to a user of the device.

Figure 2A:
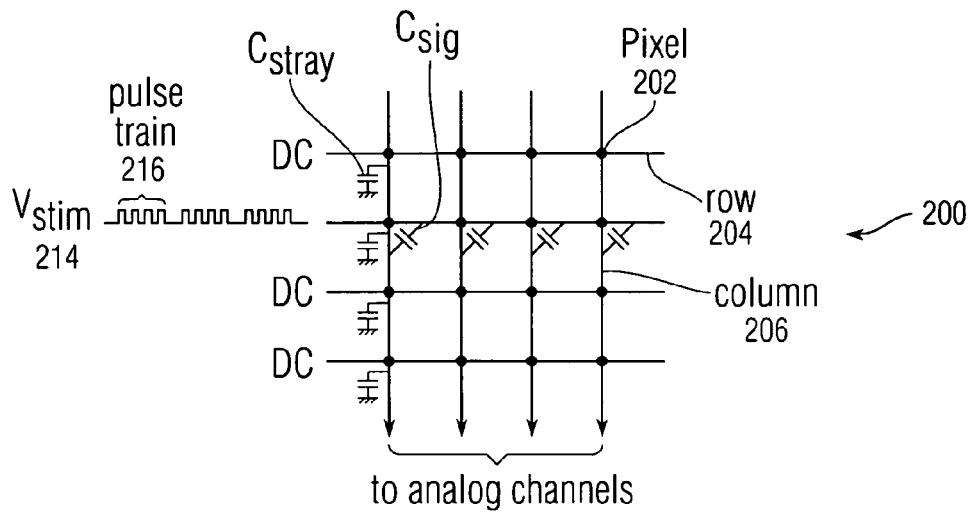
FIG. 2a illustrates an exemplary capacitive multi-touch panel.

FIG. 2a illustrates exemplary capacitive multi-touch panel 200. FIG. 2a indicates the presence of a stray capacitance Cstray at each pixel 202 located at the intersection of a row 204 and a column 206 trace (although Cstray for only one column is illustrated in FIG. 2 for purposes of simplifying the figure). Note that although FIG. 2a illustrates rows 204 and columns 206 as being substantially perpendicular, they need not be so aligned, as described above. In the example of FIG. 2a, AC stimulus Vstim 214 is being applied to one row, with all other rows connected to DC. The stimulus causes a charge to be injected into the column electrodes through mutual capacitance at the intersecting points. This charge is Qsig=Csig×Vstim. Each of columns 206 may be selectively connectable to one or more analog channels (see analog channels 108 in FIG. 1).

Figure 2B:
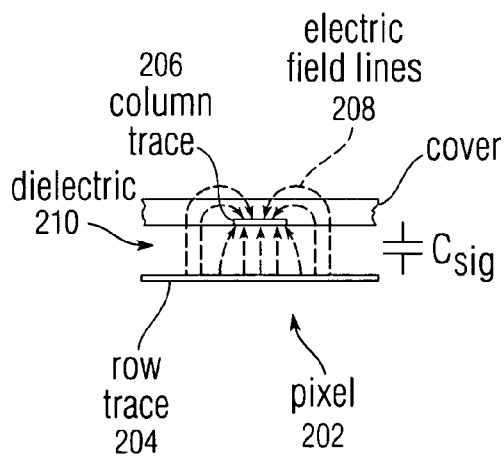
FIG. 2b is a side view of an exemplary capacitive touch sensor or pixel in a steady-state (no-touch) condition.

FIG. 2b is a side view of exemplary pixel 202 in a steady-state (no-touch) condition. In FIG. 2b, an electric field of electric field lines 208 of the mutual capacitance between column 206 and row 204 traces or electrodes separated by dielectric 210 is shown.

Figure 2C:
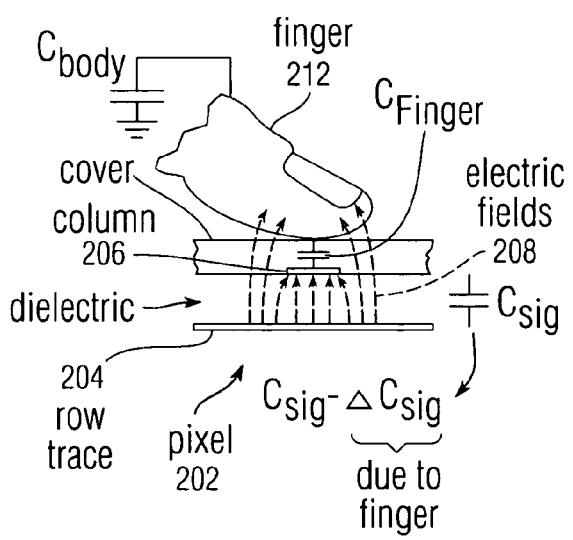
FIG. 2c is a side view of the exemplary capacitive touch sensor or pixel in a dynamic (touch) condition.

FIG. 2c is a side view of exemplary pixel 202 in a dynamic (touch) condition. In FIG. 2c, finger 212 has been placed near pixel 202. Finger 212 is a low-impedance object at signal frequencies, and has an capacitance Cfinger from the column trace 204 to the body. The body has a self-capacitance to ground Cbody of about 200 pF, where Cbody is much larger than Cfinger. If finger 212 blocks some electric field lines 208 between the row and column electrodes (those fringing fields that exit the dielectric and pass through the air above the row electrode), those electric field lines are shunted to ground through the capacitance path inherent in the finger and the body, and as a result, the steady state signal capacitance Csig is reduced by ΔCsig. In other words, the combined body and finger capacitance act to reduce Csig by an amount ΔCsig (which can also be referred to herein as Csig_sense), and can act as a shunt or dynamic return path to ground, blocking some of the electric fields as resulting in a reduced net signal capacitance. The signal capacitance at the pixel becomes Csig−ΔCsig, where Csig represents the static (no touch) component and ΔCsig represents the dynamic (touch) component. Note that Csig−ΔCsig may always be nonzero due to the inability of a finger, palm or other object to block all electric fields, especially those electric fields that remain entirely within the dielectric material. In addition, it should be understood that as a finger is pushed harder or more completely onto the multi-touch panel, the finger can tend to flatten, blocking more and more of the electric fields, and thus ΔCsig can be variable and representative of how completely the finger is pushing down on the panel (i.e. a range from "no-touch" to "full-touch").

Referring again to FIG. 2a, as mentioned above, Vstim signal 214 can be applied to a row in multi-touch panel 200 so that a change in signal capacitance can be detected when a finger, palm or other object is present. Vstim signal 214 can include one or more pulse trains 216 at a particular frequency, with each pulse train including of a number of pulses. Although pulse trains 216 are shown as square waves, other waveshapes such as sine waves can also be employed. A plurality of pulse trains 216 at different frequencies can be transmitted for noise reduction purposes to detect and avoid noisy frequencies. Vstim signal 214 essentially injects a charge into the row, and can be applied to one row of multi-touch panel 200 at a time while all other rows are held at a DC level. However, in other embodiments, the multi-touch panel may be divided into two or more sections, with Vstim signal 214 being simultaneously applied to one row in each section and all other rows in that region section held at a DC voltage.

Each analog channel coupled to a column measures the mutual capacitance formed between that column and the row. This mutual capacitance is comprised of the signal capacitance Csig and any change Csig_sense in that signal capacitance due to the presence of a finger, palm or other body part or object. These column values provided by the analog channels may be provided in parallel while a single row is being stimulated, or may be provided in series. If all of the values representing the signal capacitances for the columns have been obtained, another row in multi-touch panel 200 can be stimulated with all others held at a DC voltage, and the column signal capacitance measurements can be repeated. Eventually, if Vstim has been applied to all rows, and the signal capacitance values for all columns in all rows have been captured (i.e. the entire multi-touch panel 200 has been "scanned"), a "snapshot" of all pixel values can be obtained for the entire multi-touch panel 200. This snapshot data can be initially saved in the multi-touch subsystem, and later transferred out for interpretation by other devices in the computing system such as the host processor. As multiple snapshots are obtained, saved and interpreted by the computing system, it is possible for multiple touches to be detected, tracked, and used to perform other functions.

Figure 3A:
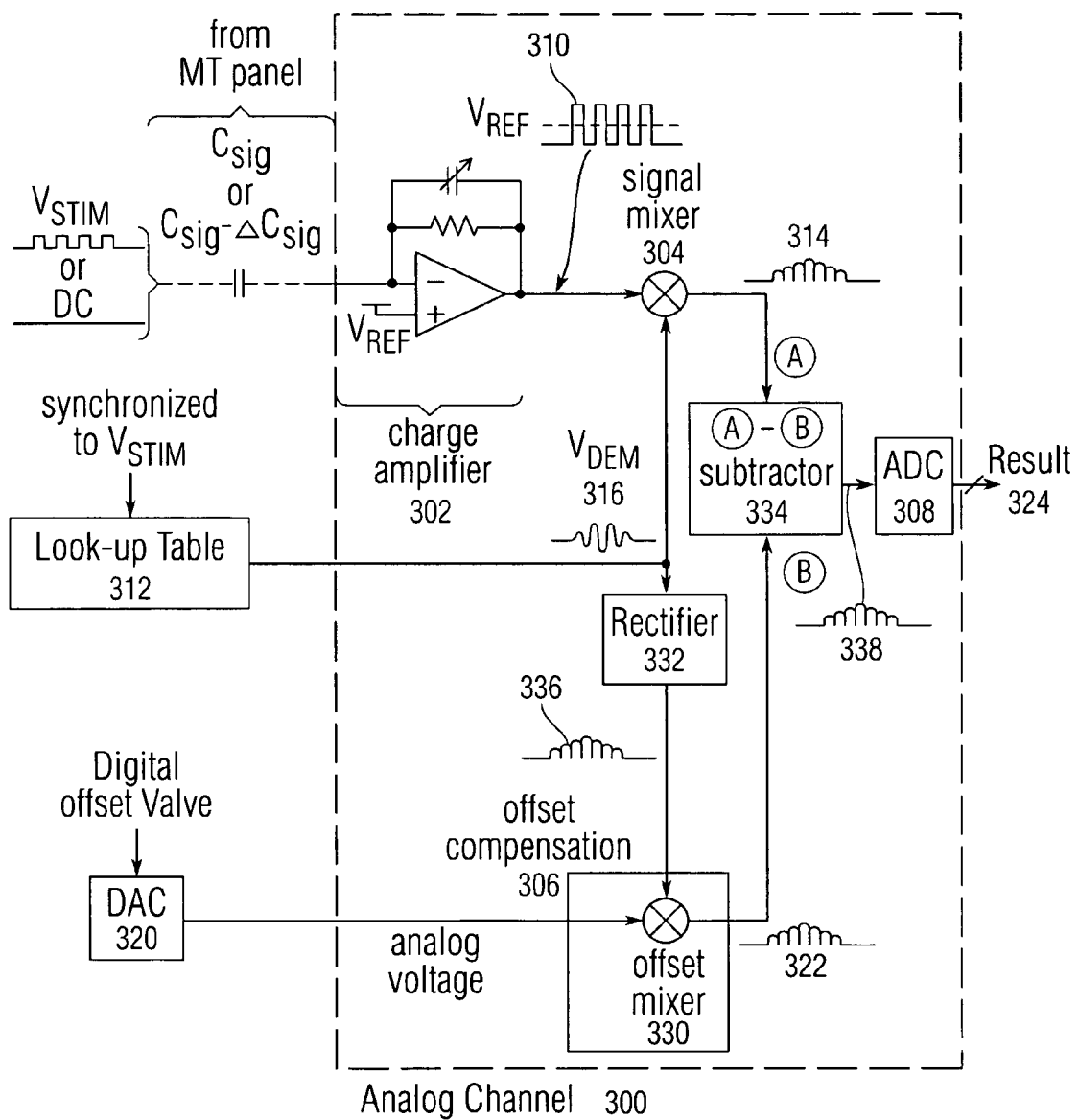
FIG. 3a illustrates an exemplary analog channel.

FIG. 3a illustrates exemplary analog channel or event detection and demodulation circuit 300. One or more analog channels 300 can be present in the multi-touch subsystem. One or more columns from a multi-touch panel can be connectable to each analog channel 300. Each analog channel 300 can include virtual-ground charge amplifier 302, signal mixer 304, offset compensation 306, rectifier 332, subtractor 334, and analog-to-digital converter (ADC) 308. FIG. 3a also shows, in dashed lines, the steady-state signal capacitance Csig that can be contributed by a multi-touch panel column connected to analog channel 300 when an input stimulus Vstim is applied to a row in the multi-touch panel and no finger, palm or other object is present, and the dynamic signal capacitance Csig−ΔCsig that can appear when a finger, palm or other object is present.

Vstim, as applied to a row in the multi-touch panel, can be generated as a burst of square waves or other non-DC signaling in an otherwise DC signal, although in some embodiments the square waves representing Vstim can be preceded and followed by other non-DC signaling. If Vstim is applied to a row and a signal capacitance is present at a column connected to analog channel 300, the output of charge amplifier 302 can be pulse train 310 centered at Vref with a peak-to-peak (p-p) amplitude in the steady-state condition that is a fraction of the p-p amplitude of Vstim, the fraction corresponding to the gain of charge amplifier 302. For example, if Vstim includes 18V p-p pulses and the gain of the charge amplifier is 0.1, then the output of the charge amplifier can be 1.8V p-p pulses. This output can be mixed in signal mixer 304 with demodulation waveform Fstim 316.

Because Vstim can create undesirable harmonics, especially if formed from square waves, demodulation waveform Fstim 316 can be a Gaussian sine wave in an otherwise DC signal that is digitally generated from look-up table (LUT) 312 or other digital logic and synchronized to Vstim. In some embodiments, Fstim 316 can be tunable in frequency and amplitude by selecting different digital waveforms in LUT 312 or generating the waveforms differently using other digital logic. Signal mixer 304 can demodulate the output of charge amplifier 310 by subtracting Fstim 316 from the output to provide better noise rejection. Signal mixer 304 can reject all frequencies outside the passband, which can in one example be about +/−30 kHz around Fstim. This noise rejection can be beneficial in noisy environment with many sources of noise, such as 802.11, Bluetooth and the like, all having some characteristic frequency that can interfere with the sensitive (femtofarad level) analog channel 300. Signal mixer 304 is essentially a synchronous rectifier as the frequency of the signal at its inputs is the same, and as a result, signal mixer output 314 is essentially a rectified Gaussian sine wave.

Offset compensation 306 can then be applied to signal mixer output 314, which can remove the effect of the static Csig, leaving only the effect of ΔCsig appearing as result 324. Offset compensation 306 can be implemented using offset mixer 330. Offset compensation output 322 can be generated by rectifying Fstim 316 using rectifier 332, and mixing rectifier output 336 with analog voltage from a digital-to-analog converter (DAC) 320 in offset mixer 330. DAC 320 can generate the analog voltage based on a digital value selected to increase the dynamic range of analog channel 300. Offset compensation output 322, which can be proportional to the analog voltage from DAC 320, can then be subtracted from signal mixer output 314 using subtractor 334, producing subtractor output 338 which can be representative of the change in the capacitance ΔCsig that occurs when a capacitive sensor on the row being stimulated has been touched. Subtractor output 338 is then integrated and can then be converted to a digital value by ADC 308. In some embodiments, integrator and ADC functions are combined and ADC 308 may be an integrating ADC, such as a sigma-delta ADC, which can sum a number of consecutive digital values and average them to generate result 324.

Figure 3B:
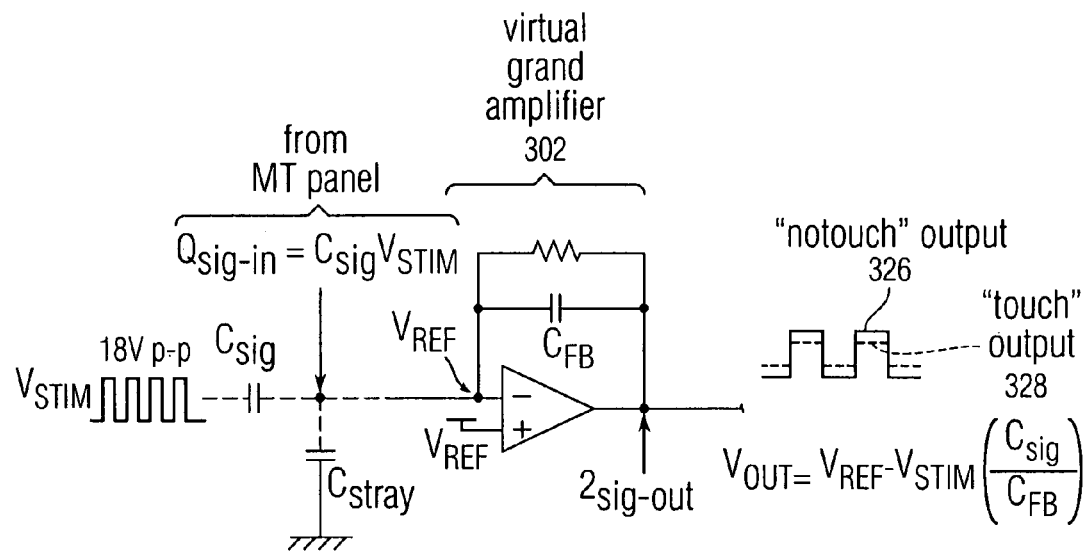
FIG. 3b is a more detailed illustration of a virtual ground charge amplifier at the input of an analog channel, and the capacitance contributed by a capacitive touch sensor and seen by the charge amplifier.

FIG. 3b is a more detailed view of charge amplifier (a virtual ground amplifier) 302 at the input of an analog channel, and the capacitance that can be contributed by the multi-touch panel (see dashed lines) and seen by the charge amplifier. As mentioned above, there can be an inherent stray capacitance Cstray at each pixel on the multi-touch panel. In virtual ground amplifier 302, with the + (noninverting) input tied to Vref, the − (inverting) input is also driven to Vref, and a DC operating point is established. Therefore, regardless of how much Csig is present, the − input is always driven to Vref. Because of the characteristics of virtual ground amplifier 302, any charge Qstray that is stored in Cstray is constant, because the voltage across Cstray is kept constant by the charge amplifier. Therefore, no matter how much stray capacitance Cstray is added to the − input, the net charge into Cstray will always be zero. Therefore the input charge Qsig_sense=(Csig−ΔCsig_sense)Vstim is zero when the corresponding row is kept at DC and is purely a function of Csig and Vstim when the corresponding row is stimulated. In either case, because there is no net charge in Cstray, the stray capacitance is rejected, and it essentially drops out of any equations. Thus, even with a hand over the multi-touch panel, although Cstray can increase, the output will be unaffected by the change in Cstray.

The gain of virtual ground amplifier 302 is usually small (e.g. 0.1) and is equivalent to the ratio of Csig (e.g. 2 pF) and feedback capacitor Cfb (e.g. 20 pF). The adjustable feedback capacitor Cfb converts the charge Qsig to the voltage Vout. Therefore, the output Vout of virtual ground amplifier 302 is a voltage that is equivalent to the ratio of −Csig/Cfb multiplied by Vstim referenced to Vref. The high voltage Vstim pulses can therefore appear at the output of virtual ground amplifier 302 as much smaller pulses having an amplitude identified by reference character 326. However, when a finger is present, the amplitude of the output can be reduced as identified by reference character 328, because the signal capacitance is reduced by ΔCsig.

Figure 3C:
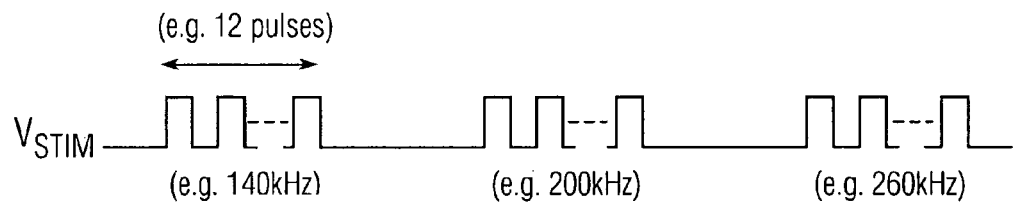
FIG. 3c illustrates an exemplary Vstim signal with multiple pulse trains each having a fixed number of pulses, each pulse train having a different frequency.

FIG. 3c illustrates an exemplary Vstim signal with multiple pulse trains each having a fixed number of pulses, each pulse train having a different frequency (e.g. 140 kHz, 200 kHz, and 260 kHz). With multiple pulse trains at different frequencies, one or more results can be obtained at each frequency. If a static interferer is present at a particular frequency, the results at that frequency can be corrupted as compared to the results obtained at the other two frequencies, and those results can be eliminated. The results at the remaining two frequencies can be averaged to compute the result.

The multiple frequencies may be applied in different ways to the multi-touch panel. In some embodiments, N columns can be connected to one analog channel via N:1 demultiplexer. A given row would then have to be stimulated N times to acquire Csig for all columns and then repeated for the other two frequencies. This has the advantage that fewer channels are needed but it takes longer to process an image. In other embodiments, one channel can be allotted for each column. A given row only has to be stimulated once to acquire Csig for all columns and then repeated for the other two frequencies. This arrangement has the advantage that it is faster then the previous arrangement described earlier; however, it takes more dedicated channels, which may be necessary for large multi-touch panels and when communications are USB, which could drop packets if too slow. After an entire "image" is captured, it can be processed. In further embodiments, multiple stimuli (scan circuits) can be applied to different rows at the same time to speed up the process. The feedback capacitance Cfb and offset can also be programmable.

Embodiments of this invention relate to the use of one or more proximity sensors in combination with one or more touch sensors in a multi-touch panel to detect the presence of a finger, body part or other object and control or trigger one or more functions in accordance with an "image" of touch provided by the sensor outputs. In some embodiments, one or more infrared (IR) proximity sensors or other types of proximity sensors can be driven with a specific stimulation frequency and emit IR light from one or more areas, which can in some embodiments correspond to one or more touch sensor "pixel" locations. The reflected IR signal, if any, can be demodulated using synchronous demodulation. In some embodiments, both physical interfaces (the touch and proximity sensors) can be connected to analog channels in the same electrical core.

The concurrent use of a multi-touch panel along with one or more proximity sensors can provide additional detection and operational capabilities not available with a multi-touch panel by itself. For example, although only the actual touching of a finger, palm or other object upon a touch-sensitive surface can be detected by a touch sensor, the mere hovering of a finger, palm or other object above a surface can be detected due to a change in the output of a photodiode amplifier in the proximity sensor. The detection of a hovering object can enable a computing system to perform certain functions that are preferentially triggered by hovering as opposed to touch. Furthermore, the use of the same analog channel design to receive both the touch sensor outputs in the multi-touch panel and the proximity sensor outputs and generate a value representative of the amount of touch or proximity of an object can enable both touch and proximity sensors to be connected to a single multi-touch subsystem for processing, eliminating the need for separate processing circuitry and reducing overall system costs.

FIGS. 1-3c and the accompanying discussion describe the ordinary operation of an electronic device including a multi-touch panel (or a proximity sensor panel). An embodiment of the present invention relates to how the same or similar device may operate in testing mode to perform a boundary scan without the necessity of additional integrated circuit pins or a large amount of additional circuitry.

Figure 4:
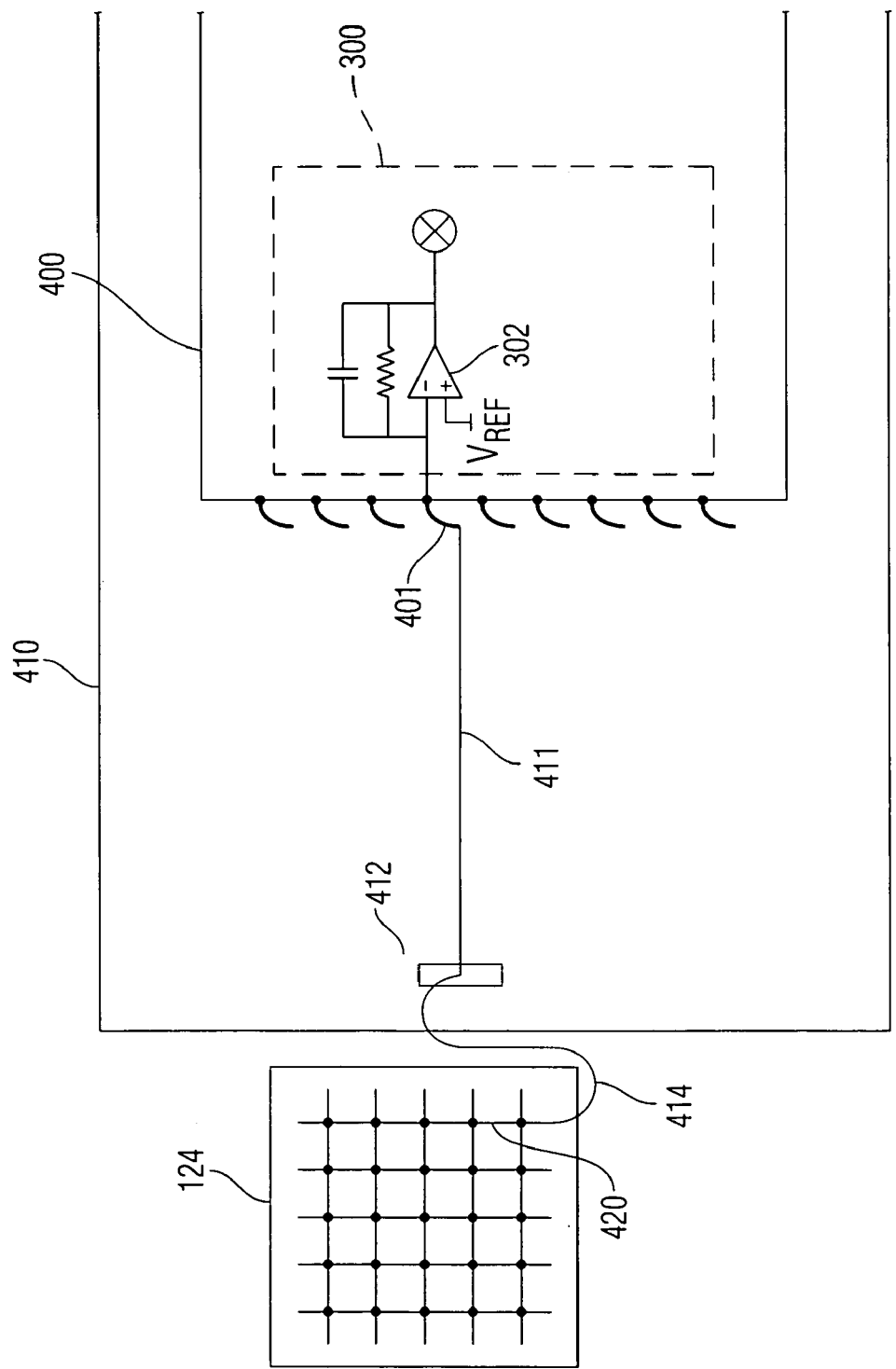
FIG. 4 is a diagram showing the physical interconnections between various elements according to one embodiment of this invention.

FIG. 4 is a diagram showing the physical interconnections between various elements according to an embodiment of the invention. Analog channel 300 of FIG. 3a may be part of integrated circuit 400 that is implemented on a chip. The analog channel can include amplifier circuit 302, as well as other elements shown in FIG. 3a (some of which are omitted from FIG. 4). The chip can include a plurality of analog channels, each associated with a single column of the multi-touch panel.

The chip can also include a plurality of pins which connect the integrated circuit to PCB 410 and also support the integrated circuit on the PCB. Analog channel 300 can be connected to one of the pins—pin 401 in the example of FIG. 4. The additional analog channels can be connected to other pins. Also, some pins may connect other, non-analog channel portions of the integrated circuit 400.

The PCB connects pin 401 to multi-touch panel 124 (or, alternatively, a proximity sensor panel) through wire 411, plug 412 and cable 414. Once connected to the multi-touch panel, the link from the analog channel may connect to a column 420 which is associated with analog channel 300. The PCB can include other elements, wires, chips, plugs, etc., which are not shown.

As discussed above, it is one of the goals of an embodiment of the invention to test whether the integrated circuit 400 is properly connected to PCB 410 and to panel 124 through the PCB. This test may be performed using pin 401. Furthermore, one or more circuits of the analog channel (such as amplifier 302) which perform an independent function during ordinary operation (e.g., sensing touch events from the multi-touch panel) may also be used for the test with slight additions and modifications.

The test may be performed by all analog channels of the integrated circuit 400, so that multiple pin connections, PCB and cable wires can be tested. However, in one embodiment, only pins associated with the analog channels are used. In other words, no pins exclusively dedicated to boundary scanning are necessary.

It is noted that in many electronic devices a stray capacitance can develop for all wires cables, pins, or other conductive connections. This is the case because electronic devices in general, and portable electronic devices in particular, feature many closely spaced conductors, such as wires, cables, etc. A capacitance can develop between any two or more closely spaced conductors. If most of the circuits of a device are grounded, most stray capacitances that do develop will be to ground. Capacitances connected in a parallel fashion can be added to obtain a single effective capacitance. Therefore, if various different wires and cables are connected in series (resulting in parallel stray capacitances), they may create a total stray capacitance which is the sum of the stray capacitances of all individual elements. Thus, by measuring stray capacitance at a node and referring to known values of stray capacitances of elements that may be connected to the node, an embodiment of the invention can determine which elements are and which are not connected to that node.

Figure 5:
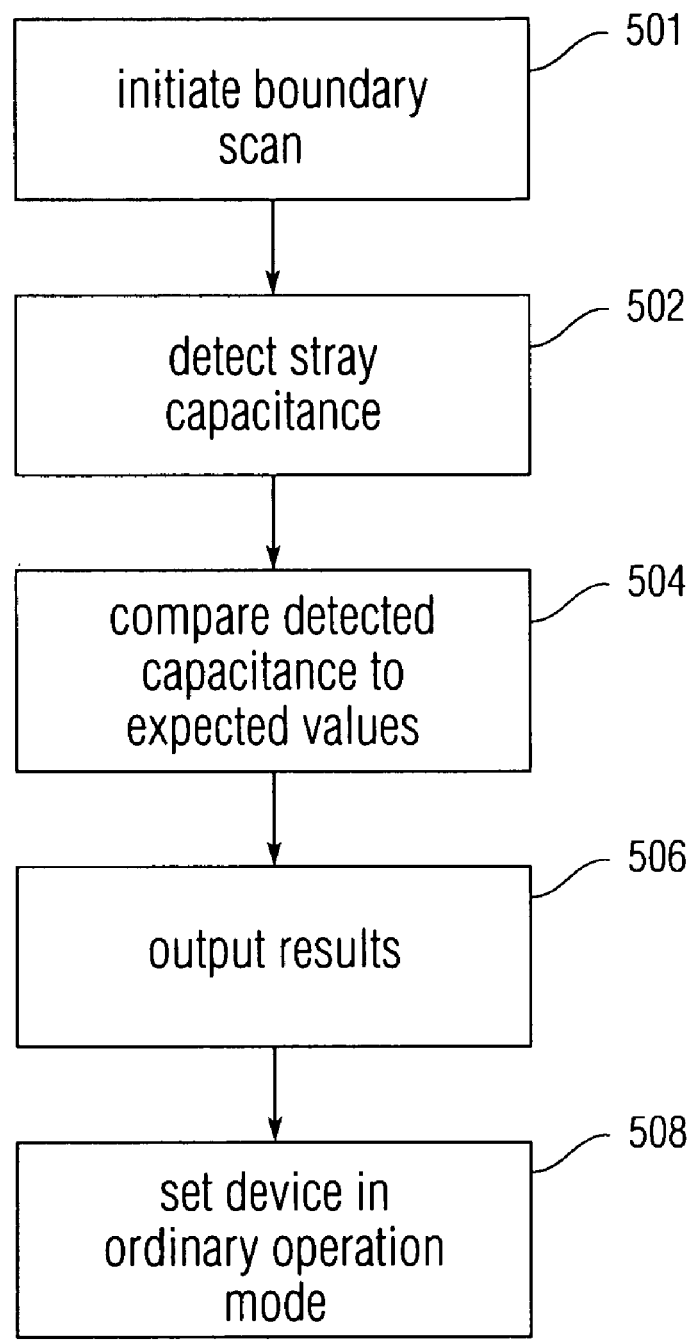
FIG. 5 is a flow chart showing a method of operation of one embodiment of this invention.

FIG. 5 is a flow chart showing a method of operation of one embodiment of the present invention. At step 500, a boundary scan is initiated. This requires that various circuits, such as circuits within the analog channel 300 be configured in boundary scan mode. Setting circuits to boundary scan mode can be performed automatically by the circuits themselves upon receipt of predefined control signals. The changes required to set the circuits to boundary scan mode are discussed in more detail below.

All analog channels that participate in the boundary scan may be set to boundary scan mode. One or more of the analog channels 108 can participate. In one embodiment, all existing channels 108 participate in the boundary scan. This provides for more reliable testing as it ensures that the boundary scan tests a high number of connections. In one embodiment, the multi-touch display is also set in boundary scan mode by connecting its row electrodes to ground. This may be performed, for example, by having decoder 120 connect all multi-touch row inputs 122 to ground upon receipt of a predefined control signal.

At step 502, the participating analog circuits detect a stray capacitance at each respective pin. This step may be performed simultaneously by all participating analog circuits. The detected stray capacitances may be based on signals that are processed and digitized by the analog channels and the channel scan logic and then digitally processed by the multi-touch panel processor. This may be done in a manner similar to the processing of analog signals for detecting touch events during ordinary operation of the device described in more detail above with reference to FIGS. 1-3.

At step 504, the detected capacitances are compared to expected values. One or more expected capacitance values are determined and stored in the device. Each expected value can be associated with the capacitance of one or more elements that can be connected to an analog circuit. In practice, stray capacitances may be determined empirically by measuring various capacitances in a prototype device.

Figure 6:
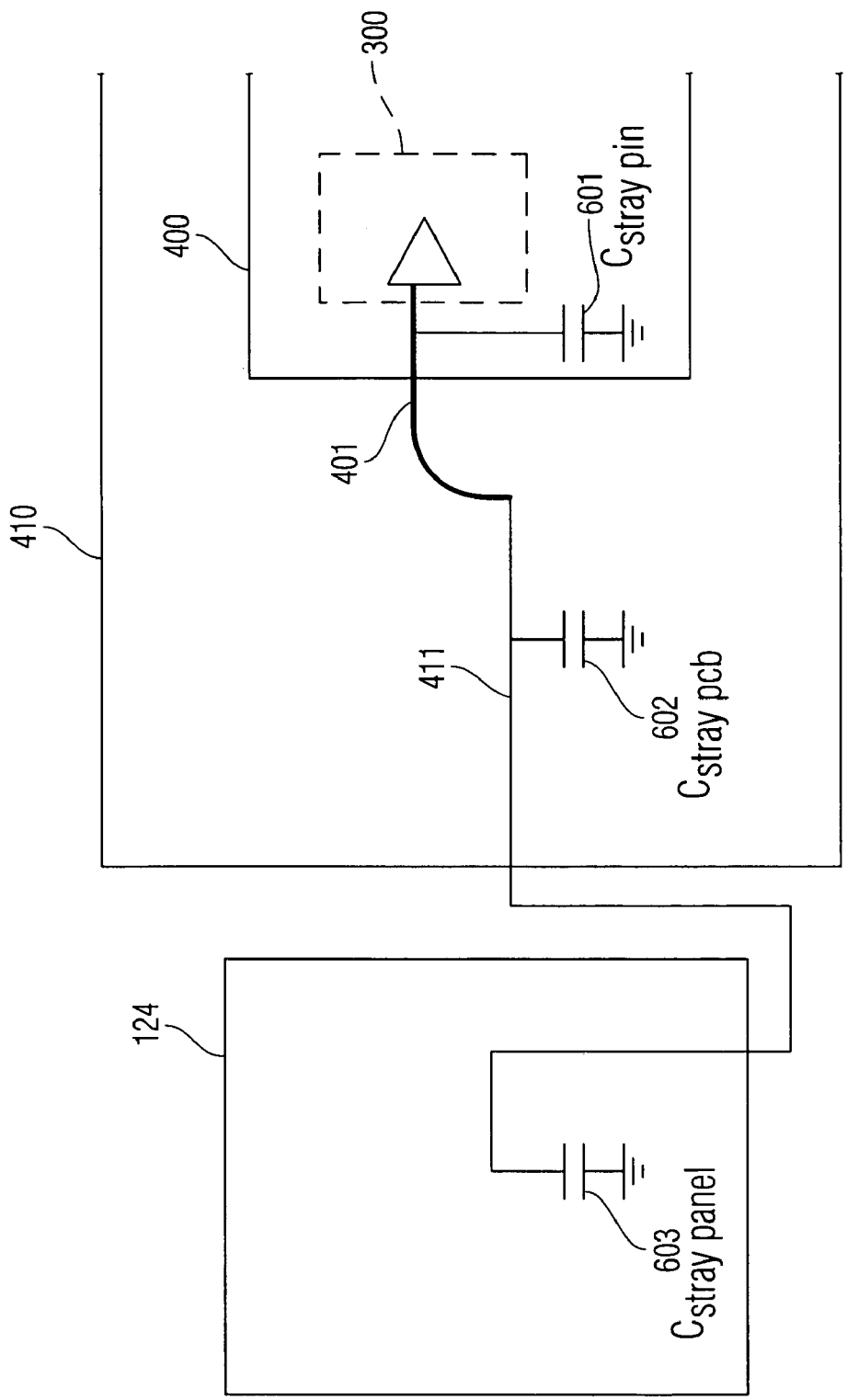
FIG. 6 is a diagram that shows the stray capacitances of various elements that can be connected to an analog channel.

FIG. 6 is a diagram that shows the stray capacitances of various elements that can be connected to an analog channel. As discussed above in connection with FIG. 4, analog channel 300 may be placed on an integrated circuit chip 400 which can be placed on a PCB 410. The PCB can be connected to multi-touch panel 124.

The pin 401 to which the analog channel is connected to can have a stray capacitance Cstraypin (601). A wire on the PCB that connects the pin to the multi-touch panel may have stray capacitance Cstraypcb (602). And finally, the panel can have its own associated stray capacitance Cstraypanel (603). The stray capacitance of the panel is discussed in more detail below with reference to FIG. 7.

Table 1 shows the various capacitance values that may appear at pin 401 depending on the elements that are connected to it. As shown in Table 1, if no elements are connected to the pin (i.e. the pin is not properly connected to the PCB), the only capacitance that will appear at the pin would be Cstraypin. If the pin is properly connected to the PCB, but the panel is not properly connected to the PCB, then a capacitance of (Cstraypin+Cstraypcb) will appear. If the pin is properly connected to the PCB and the PCB is properly connected to the panel, then a capacitance of (Cstraypin+Cstraypcb+Cstraypanel) will appear.

TABLE 1

|  | connected elements | | |
| --- | --- | --- | --- |
|  | None | PCB | PCB and Panel |
| expected capacitance | Cstraypin | Cstraypin + Cstraypcb | Cstraypin + Cstraypcb + Cstraypanel |

Three values reflecting expected values of Cstraypin, (Cstraypin+Cstraypcb) and (Cstraypin+Cstraypcb+Cstraypanel), respectively may be saved as the expected capacitance values. As discussed above, the actual numerical values for these capacitances can be obtained by empirical testing. In an alternative embodiment additional expected values may be used. For example, referring to FIG. 4, separate expected capacitance values may be used for plug 412 and cable 414. If additional elements are connected to pin 401, expected capacitance values can be provided for them.

In addition, two or more expected capacitance values can be used for certain conductors (such as, for example, wire 411) that are relatively long and/or prone to be manufactured with interruptions and breakages. For example, there can be a first expected capacitance value associated only with a first portion of wire 411 which is closer to pin 401. This capacitance value may signify that only an initial portion of the wire is connected to the pin. In other words, this value may signify a breakage somewhere along wire 411. There can also be a second expected capacitance value associated with the entire wire 411, which signifies that there is no breakage. In general, the various expected capacitance values can be selected based on the elements that are expected to be connected to pin 401 and for which boundary testing is performed.

In one embodiment, a single set of expected capacitance values are stored, and this set is used for the testing of all analog channels 108. In an alternative embodiment, different sets of expected capacitance values are provided for each analog channel, or each of two or more groups of analog channels. Using different sets of expected capacitance values may be beneficial if the pins associated with different analog circuits are connected to different elements. For example, different pins may be connected to different wires on the PCB, and each wire may feature different expected stray capacitance Cstraypcb. This may be the result of differing lengths of the various wires, or different positioning of the wires so that certain wires are closer to stray capacitance-causing conductors than other wires.

Referring back to FIG. 5, the comparison between the detected capacitance and expected values need not require an exact match. In other words, there may be a predefined range associated with each expected capacitance and the comparison may determine if the detected capacitance falls within that range to establish a match to an expected capacitance value. In another embodiment, the expected capacitance values may be explicitly defined in terms of ranges and not single values. The comparisons may be performed by the multi-touch panel processor. In an alternative embodiment, the comparisons can be performed by host processor 128.

At step 506, the results of the comparison are output. These results can indicate which elements are connected to the integrated circuit in general, or to specific pins in particular. Thus, the results may indicate specific connection states for each pin connected to an analog channel, or general connection states derived from specific pin connection data. The results can be processed by the multi-touch panel processor and sent out of the integrated circuit 400 using a digital interface. The results can then be output to an external testing device using an external interface of the device of the present invention. As discussed above, in an alternative embodiment, the results can be processed by the host processor.

The interfaces used for sending out the results need not be exclusively dedicated for boundary scanning. For example, the pins through which multi-touch panel processor 102 sends out the results may also be used for sending other digital signals during normal operation of the device, such as, for example, digital signals specifying touch events on the panel. The external interface of the device through which the results are sent out to an external testing device may be used for other inter-device communication during ordinary operation, such as, for example, for outputting digital sound (if the device is a digital music player), or for loading telephone and address information (if the device is a mobile telephone).

In an alternative embodiment, the device does not output processed results indicating connection states, but instead outputs raw (preferably digitized) detected stray capacitance values. An external testing circuit can then compare the detected stray capacitance values with expected values and make determinations as to the various connection states. This embodiment can be advantageous because it provides more data to the external testing circuit. Thus, the external testing circuit can compensate for changing conditions (i.e., it can change the expected capacitance values based on newly received data), or it can perform more complex processing, as external testing circuits often have higher computational power than the devices they test. A possible disadvantage of this alternative is that relatively large amounts of data must be sent from the device to the external testing circuit which, depending on the device's interface, may be impractical. At step 508, the boundary scan is concluded and the device is set to an ordinary operation mode.

In one embodiment, the boundary scanning procedure discussed above can be performed multiple times as different elements are connected to integrated circuit 400 during manufacture. For example, at a first stage the integrated circuit may be mounted onto the PCB. A first iteration of the boundary scan process may be performed then to ensure that the mounting on the PCB was properly performed. At a second stage of manufacture, the multi-touch panel can be connected to the PCB as well. At this stage a second iteration of the boundary scan can be performed to ensure that the panel as properly connected.

Repeating the boundary scan process at different stages of manufacture can ensure that problems are detected at the early stages of manufacture of a device. Thus, problems can be corrected more easily. Alternatively, if correction is not possible or cost effective, the losses of improperly manufactured elements may not be as great as their defects can be detected before too many additional elements are added onto these devices. Specifically, it can be of a significant benefit to be able to detect errors, before a relatively costly multi-touch panel is mounted. Otherwise, well functioning panels may need to be discarded because, for example, they have been attached to a malfunctioning PCB.

Figure 7:
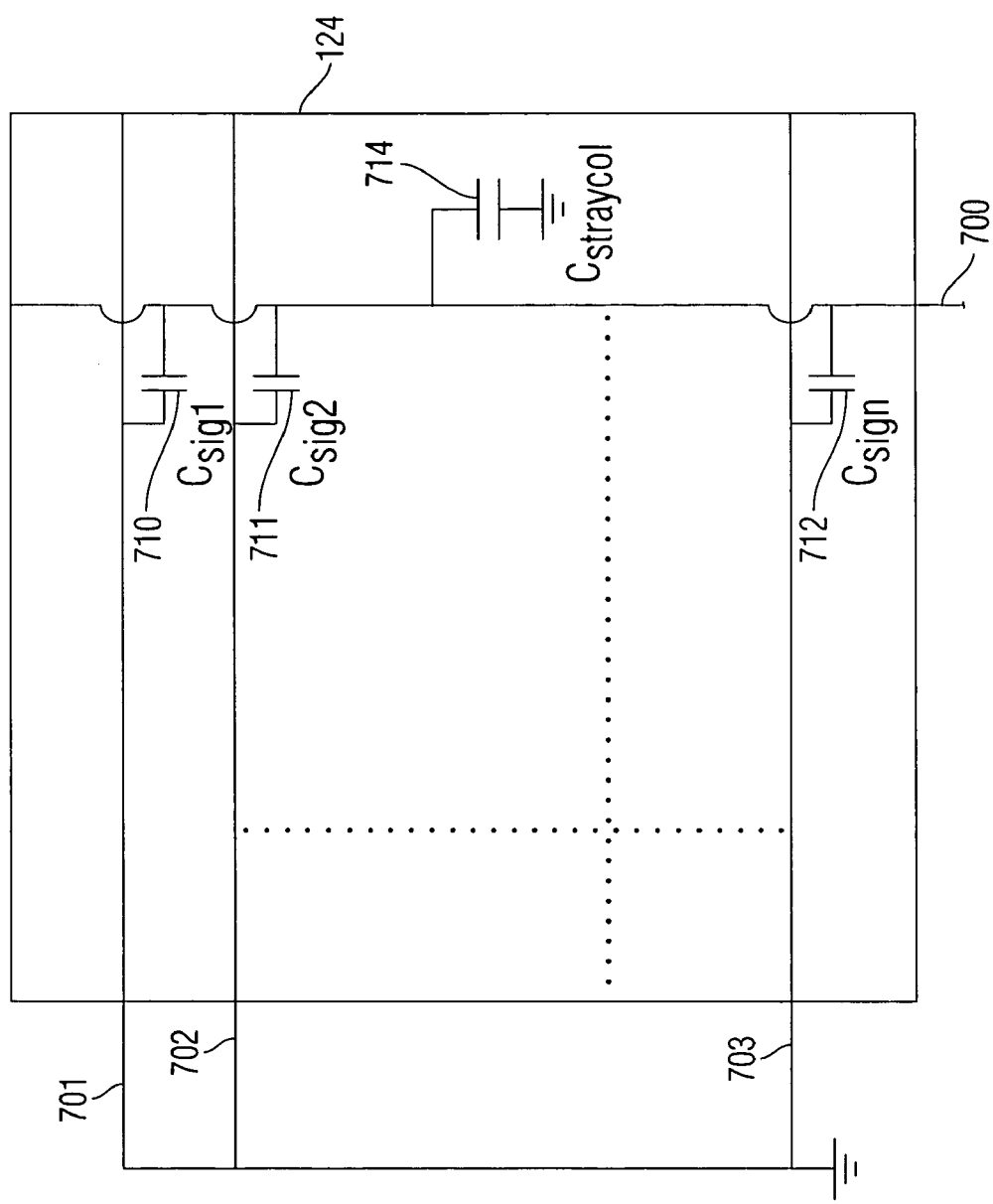
FIG. 7 is a diagram illustrating some additional details about the stray capacitance of the multi-touch panel.

FIG. 7 is a diagram illustrating some additional details about the stray capacitance of the multi-touch panel. FIG. 7 shows a single column electrode in the multi-touch panel. Column electrode 700 can be connected to pin 401 and consequently to analog channel 400 (see FIG. 4). Other column electrons may also be present and connected to other pins and other analog channels. Column electrode 700, being a conductor, has a stray capacitance Cstraycol (714) associated with it. However this capacitance is not the only contribution to the stray capacitance of the panel Cstraypanel as detected at pin 401.

Various row electrodes may intersect column electrode 700 (row electrodes 701, 702 and 703 are shown, but there may be additional ones). At each intersection of column electrode 700 and a row electrode, a capacitance Csig is formed (see, e.g., capacitances 710, 711, 712). The multiple Csig capacitances can be designated <Csig1 ... Csign>, wherein n is the number of row electrodes intersecting column electrode 700. As discussed above, variations in these capacitances are used to detect touches on the multi-touch panel under ordinary operation of the device.

However, in boundary scan mode, the various rows can be connected to ground. Therefore, capacitances Csig1 ... Csign may be similar to capacitance Cstraycol in that they are capacitances to ground that are connected to column electrode 700. For that reason, for the purposes of one embodiment of the invention, capacitances Csig1 ... Csign may be treated as stray capacitances. Therefore, the total stray capacitance of panel 124 can be:

$$Cstraypanel = Cstraycol + Csig1 + Csig2 + \ldots + Csign \qquad \text{EQ1:}$$

In some embodiments, other stray capacitances associated with the panel can be added to the above sum. For example a capacitance associated with cable 414 (see FIG. 4) connecting the panel to the PCB can be added. In some cases, identification of the exact components of the stray capacitance of the panel may not be necessary, as the total Cstraypanel can be obtained experimentally.

Figure 8A:
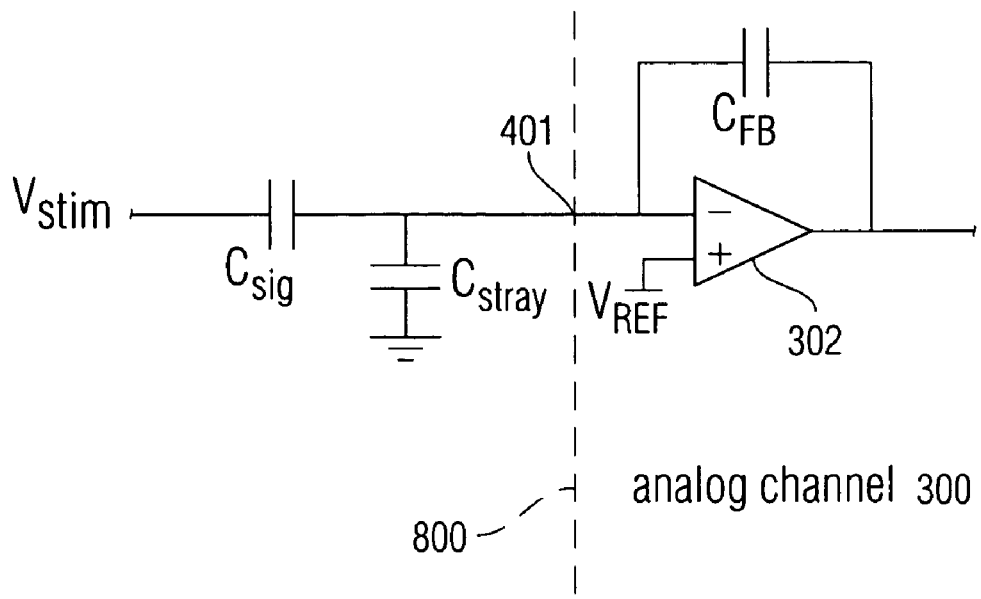
FIG. 8a is a diagram of an amplifier circuit at the input of an analog channel placed in ordinary operation mode.
Figure 8B:
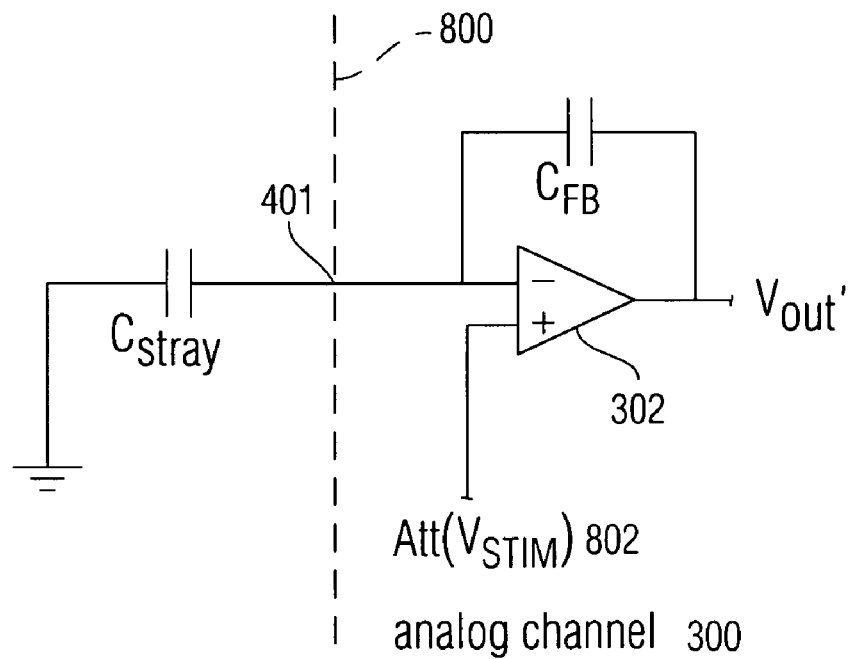
FIG. 8b is a diagram of an amplifier circuit at the input of an analog channel placed in a boundary scanning mode.

FIGS. 8a and 8b are diagrams showing an analog channel in ordinary operation and boundary scanning modes, respectively. Line 800 in both drawings indicates a border between analog channel circuitry inside of integrated circuit 400 and elements external to the integrated circuit. As can be seen, a pin, such as pin 401, can connect the analog channel to the external circuitry.

FIG. 8a shows the version of the analog channel that is used in normal operation of the device. Thus, FIG. 8a is similar to FIG. 3b. An amplifier circuit 302 may be run as an inverting charge amplifier. A stable reference voltage Vref can be applied at the positive input of the amplifier and a stimulation signal Vstim can be run through a capacitance Csig and applied to the negative input. A feedback capacitance Cfb can also be present (a feedback resistance is not shown but may also be present).

As shown in FIG. 8b, the same operational amplifier 302 may be reconfigured in the boundary scanning mode. In that mode, the amplifier is configured to be non-inverting. As all rows of the multi-touch display may be grounded during boundary scanning mode, pin 401 is not connected to a stimulation signal (as in FIG. 8a), but is merely connected to a stray capacitance Cstray to ground. As discussed above, the actual value of the stray capacitance may depend on the number and type of elements connected to pin 401. Also as discussed above, one or more Csig capacitances may be part of that stray capacitance as well.

Therefore, the actual input signal of the FIG. 8b amplifier is not connected to the negative input as in FIG. 8a, but to the positive input. The input signal can be an attenuated (i.e., diminished in voltage) version of the stimulation signal Vstim 802. In one embodiment the attenuated stimulus signal may feature a peak to peak amplitude of 150 mV. The attenuated Vstim signal is an attenuated version of the stimulus signal that is passed from the channel scan logic to the driver interface.

Signal 802 may need to be attenuated because the amplifier circuit 302 in FIG. 8b can be operating in non-inverting mode. In other words, the amplifier can operate in a mode that amplifies (increases) the amplitude of the input signal 802. Therefore, if the input stimulation signal is at its usually high voltage, the amplifier may become saturated or, in other words, it may be placed outside its desirable response range.

The circuit of FIG. 8b can result in output signal Vout'. Signal Vout' may be distinguished from signal Vout (see FIG. 3b), as Vout' refers to the output signal produced during the boundary scanning mode, while Vout is produced during ordinary operation. Signal Vout' is an amplified version of input attenuated Vstim signal, the level of amplification depending on the stray capacitance Cstray. More specifically, the amplification of signal Vout' may be as follows:

$$\text{Amplification}(Vout') = Vout'/(\text{Att}(Vstim)) = 1 + Cstray/Cfb \qquad \text{EQ2:}$$

Since the feedback capacitance Cfb and the voltage of the attenuated stimulation signal may be known, the amplification of signal Vout' may be used to determine the stray capacitance Cstray. In other words, the stray capacitance can be determined as follows:

$$Cstray = (\text{Amplification}(Vout') - 1) \cdot Cfb \qquad \text{EQ3:}$$

Once signal Vout' is generated, it may be processed, digitized and sent to the multi-touch panel processor in a manner similar to that described in connection with FIG. 3a. In other words, in the boundary scanning mode, signal Vout' can be processed in a similar manner and using similar circuits and components as in the processing of the output signal Vout produced during ordinary operation of the analog channel.

As a result of the processing, multi-touch panel processor 102 can eventually receive a value indicative of the amplitude of signal Vout' and from there determine the stray capacitance Cstray. The multi-touch panel processor can then compare the obtained Cstray to the predefined values of expected capacitances to determine which elements are connected to pin 401. As discussed above, in an alternative embodiment these digital processing steps may be performed by the host processor instead.

Figure 9:
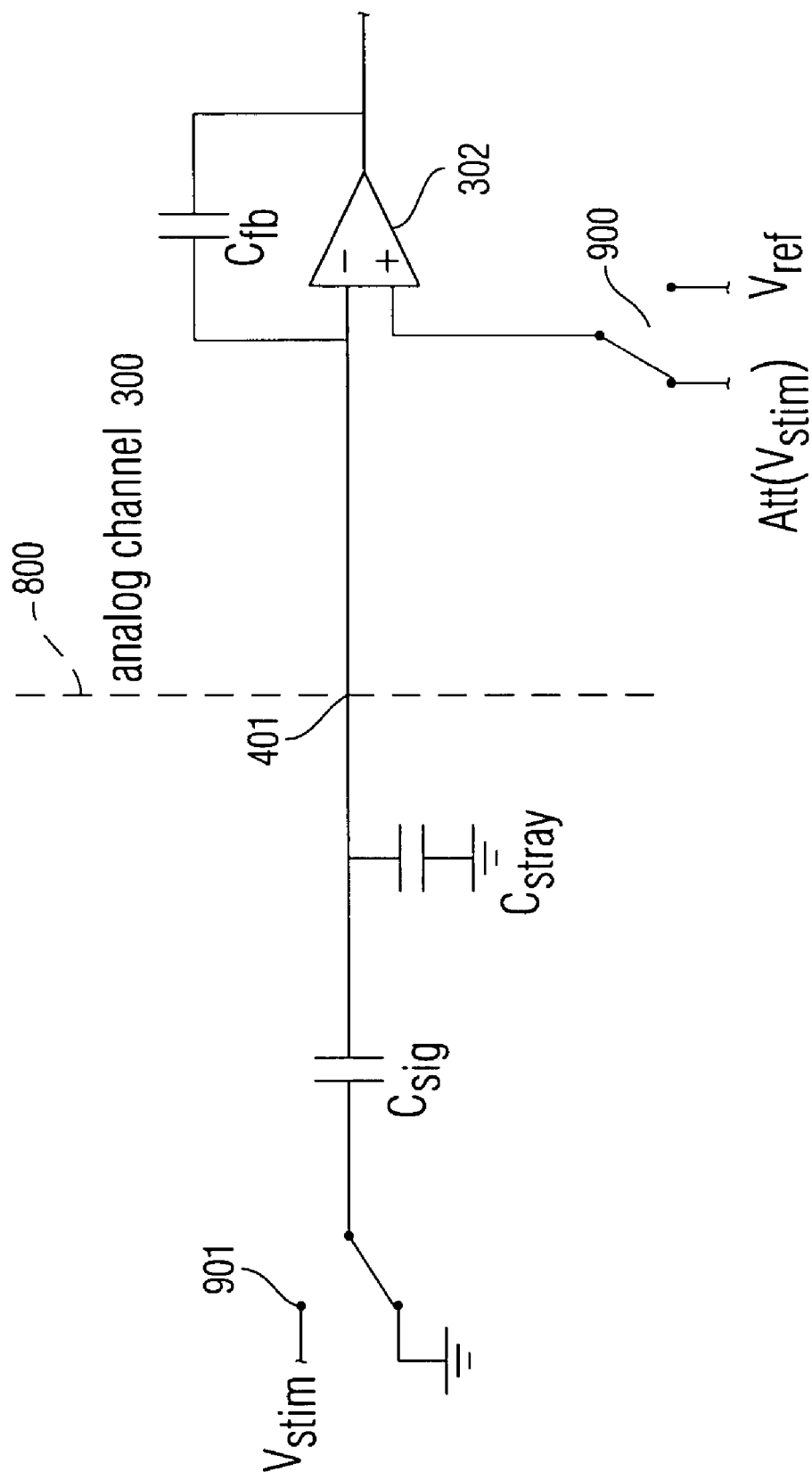
FIG. 9 is a diagram of an analog channel which can switch between ordinary operation and boundary scanning modes according to one embodiment of this invention.

FIG. 9 is a diagram of an analog channel which can switch between ordinary operation and boundary scanning modes according to one embodiment of the invention. As shown, switch 900 can switch the positive input of operational amplifier 302 to Vref (in ordinary operation mode) or to the attenuated Vstim (in boundary scanning mode). Similarly, switch 901 can switch the input signal at one or more rows of the multi-touch panel from stimulation signal to Vstim (ordinary operation mode) or to ground (boundary scanning mode). As discussed above, during boundary scanning mode, the capacitance Csig can be connected to ground, and thus may be considered to be a portion of the stray capacitance Cstray. FIG. 9 is presently shown in boundary scanning mode. Switches 900 and 901 may be controlled by channel scan logic 110 and/or multi-touch panel processor 102.

The stray capacitance mode can also be used to detect a touch condition. If a finger touches a column electrode, a stray capacitance of dCstray is added to that column. The stray capacitance dCstray is essentially the series combination of the finger capacitance Cfinger between the finger and the column electrode and the body capacitance Cbody between the user's body to ground. For example if the finger capacitance is 1 pF and the body capacitance is 250 pF then the change in stray capacitance of the column of interest is slightly less than 1 pF. Stray capacitance mode is useful when the system is in a lower power management state. When no activity (no touch) is detected it is desirable for the system to transition into a lower power state, thus conserving power. However, it is still required for the system to wake up periodically to scan the panel for activity. In order to conserve power, the time needed to scan the panel for activity should be as small as possible. In normal mode, each pixel is checked and every row needs to be scanned to detect touch. For example, if it takes 250 us to scan a row and the multi-touch panel has 16 rows, then it would take a total of 4 ms to scan the entire panel. However, if stray capacitance mode is used, it only takes one measurement to scan all columns at once to detect a possible increase in stray capacitance and thus a touch condition. That means that in stray capacitance mode it takes $\frac{1}{16}^{th}$ of the time to scan for a touch condition, thus conserving substantial amounts of power. Please also refer to the patent application titled "MULTI-TOUCH AUTO SCANNING" (client reference no. 10684-2001900, filed on Ser. No. 11/650,040, and herein incorporated by reference in its entirety).

While the above discussion centers on embodiments associated with touch sensitive or proximity sensitive displays, this may not be true for all embodiments of the invention. In general, an embodiment of the invention may feature any type of electronic device. The device may include an integrated circuit which includes one or more pins, and one or more interface circuits each connected to a respective pin. The analog channels may be more specific examples of these interface circuits.

The interface circuits can be at least partially analog. The analog interface circuits can operate in two modes. A first mode is an ordinary operation mode in which these circuits perform functions related to the ordinary operation of the device. A second mode is a boundary scan mode, in which the interface circuits are reconfigured to perform a boundary scan in order to determine which other elements are connected to these circuits through their respective pins.

The boundary scan can be performed by each interface circuit by sensing a stray capacitance at its respective pin. At least one element of the interface circuit can be used both for the ordinary operation mode and for the boundary scan mode. In one embodiment, this one commonly used element can be an operational amplifier. In one embodiment more than one elements of the interface circuit can be used for both modes. For example, an entire signal processing and digitizing channel can be used for both modes.

Although the present invention has been fully described in connection with embodiments thereof with reference to the accompanying drawings, it is to be noted that various changes and modifications will become apparent to those skilled in the art. Such changes and modifications are to be understood as being included within the scope of the present invention as defined by the appended claims.

What is claimed is:

1. An integrated circuit capable of performing a boundary scan, comprising:
   a plurality of pins; and
   an interface circuit connected to a pin that is one of the plurality of pins, and configured to operate in:
      a boundary scan mode to obtain a signal indicative of a stray capacitance present at the pin, the stray capacitance representative of a connection state of one or more external elements in relation to the pin, and
      an ordinary operation mode to perform functions related to an ordinary operation of the integrated circuit, said functions being distinct from any boundary scan operations.

2. The integrated circuit of claim 1, wherein the connection state of the one or more external elements in relation to the pin is associated with a set of one or more external elements connected to the pin in series.

3. The integrated circuit of claim 2, wherein each of the one or more external elements has a stray capacitance associated therewith, and the stray capacitance sensed by the interface circuit is the sum of the stray capacitances of the set of one or more connected elements.

4. The integrated circuit of claim 1, wherein the connection state of the one or more external elements in relation to the pin is a state of absence of any connection between the external elements and the pin.

5. The integrated circuit of claim 1, wherein at least one element of the interface circuit is used in both boundary scan and ordinary operation modes.

6. The integrated circuit of claim 5, wherein the at least one element used in both modes includes an operational amplifier.

7. The integrated circuit of claim 6, wherein the operational amplifier is used in inverting mode when the interface circuit is operating in ordinary operation mode, and in non-inverting mode, when the interface circuit is operating in boundary scan mode.

8. The integrated circuit of claim 1, wherein the integrated circuit further comprises a memory and a comparison module,
   the memory including one or more predefined expected capacitance values, wherein each expected capacitance value is associated with a respective set of one or more external elements which together cause a stray capacitance equal to the expected capacitance value,
   the comparison module being configured to receive the signal indicative of the stray capacitance, derive a stray capacitance value from it and compare the derived stray capacitance value to the one or more predefined expected capacitance values in order to determine which set of one or more external elements is connected to the pin.

9. The integrated circuit of claim 8, wherein the memory further includes an expected capacitance value associated with an indication that no external elements are connected to the pin and the comparison module is further configured to determine that no external elements are connected to the pin.

10. The integrated circuit of claim 8, wherein the comparison module comprises a programmable processor.

11. The integrated circuit of claim 8, further including two or more internal malfunction expected capacitance values associated with a single set of one or more external elements, wherein the internal malfunction expected capacitance values are associated with different expected capacitances which can result from the presence or absence of internal malfunctions of one or more elements of the single set of one or more external elements.

12. The integrated circuit of claim 1, wherein the interface circuit is configured to switch between ordinary operation and boundary scan mode based on external control signals.

13. The integrated circuit of claim 1, wherein the interface circuit is configured to obtain a signal indicative of an external condition in the ordinary operation mode.

14. The integrated circuit of claim 13, wherein the interface circuit is configured to:
   process and digitize the signal indicative of an external condition during ordinary operation mode; and
   to process and digitize the signal indicative of the stray capacitance present at the pin,
   wherein the processing and digitizing of the two signals during the two modes is performed using the same circuitry.

15. The integrated circuit of claim 13, wherein one of the one or more external elements is a touch sensitive panel, and the external condition is a touch event on the touch panel.

16. The integrated circuit of claim 13, wherein one of the one or more external elements is a proximity sensitive panel, and the external condition is a hover event at the proximity sensitive panel.

17. The integrated circuit of claim 1, wherein the integrated circuit further includes a plurality of interface circuits and associated pins.

18. The integrated circuit of claim 1, wherein the device is a mobile telephone.

19. The integrated circuit of claim 1, wherein the device is a digital audio player.

20. The integrated circuit of claim 1, the integrated circuit incorporated into a mobile telephone, the mobile telephone comprising:
a printed circuit board; and
a touch sensitive panel mounted on the printed circuit board;
wherein the integrated circuit is mounted on the printed circuit board and includes an analog channel connected to the pin and configured to
operate in the boundary scan and ordinary operation modes,
sense a stray capacitance at the pin in the boundary scan mode, and
sense a touch event on the touch sensitive panel in the ordinary operation mode.

21. The integrated circuit of claim 1, the integrated circuit incorporated into a digital audio player, the digital audio player comprising:
a printed circuit board; and
a touch sensitive panel mounted on the printed circuit board;
wherein the integrated circuit is mounted on the printed circuit board and includes an analog channel configured to
operate in the boundary scan and ordinary operation modes,
sense a stray capacitance at the pin in the boundary scan mode, and
sense a touch event on the touch sensitive panel in the ordinary operation mode.

22. The integrated circuit of claim 1, the integrated circuit incorporated into an electronic device, the electronic device comprising:
a printed circuit board; and
a touch sensitive panel mounted on the printed circuit board;
wherein the integrated circuit is mounted on the printed circuit board and includes an analog channel configured to
operate in the boundary scan and ordinary operation modes,
sense a stray capacitance at the pin in the boundary scan mode, and
sense a touch event on the touch sensitive panel in the ordinary operation mode; and
wherein the touch sensitive panel is stimulated with a stimulation signal during ordinary operation mode but not during a sleep mode.

23. The integrated circuit of claim 22, wherein:
the electronic device is also configured to operate in sleep and ordinary operation modes which coincide with sleep and ordinary operation modes of the analog channel; and
the integrated circuit is configured to note changes of the sensed stray capacitance at the pin which indicate a touch event on the touch panel and, in response to said changes, change the mode of the electronic device from sleep mode to ordinary operation.

24. The integrated circuit of claim 1, the integrated circuit incorporated into an electronic device, the electronic device comprising:
a printed circuit board; and
a touch sensitive panel coupled to the printed circuit board;
wherein the integrated circuit is mounted on the printed circuit board and includes an analog channel connected to the pin and configured to
operate in the boundary scan and ordinary operation modes,
sense a stray capacitance at the pin in the boundary scan mode, and
sense a touch event on the touch sensitive panel in the ordinary operation mode.

25. The integrated circuit of claim 24, wherein the stray capacitance is indicative of which elements are connected to the pin.

26. The integrated circuit of claim 25, further comprising a comparison module connected to the analog channel and configured to receive the sensed stray capacitance from the analog channel and determine whether the printed circuit board is electrically connected to the pin based on the stray capacitance.

27. The integrated circuit of claim 26, wherein the comparison module is further configured to determine whether the touch sensitive panel is electrically connected to the pin through the printed circuit board based on the stray capacitance.

28. The integrated circuit of claim 26, further comprising a memory comprising one or more expected capacitance values, wherein the comparison module is configured to make said determination based on a comparison of the sensed stray capacitance with one or more of the one or more expected capacitance values.

29. The integrated circuit of claim 26, wherein the comparison module comprises a touch panel processor.

30. The integrated circuit of claim 25, wherein the analog channel comprises an operational amplifier and the operational amplifier is used in both modes.

31. The integrated circuit of claim 30, wherein:
a first input of the operational amplifier is connected to the pin and a second input of the operational amplifier is not connected to the pin;
during the ordinary operation mode, the first input receives an oscillating signal; and
during the boundary scan mode, the second input receives an oscillating signal.

32. The integrated circuit of claim 25, wherein the analog channel is configured to generate:
a first signal indicative of the presence of a touch event in the ordinary operation mode; and
a second signal indicative of the stray capacitance in the boundary scan mode;
wherein the analog channel further includes processing circuitry for processing and digitizing a generated signal, said processing circuitry being used for both the first signal in the ordinary operation mode and the second signal in the boundary scan mode.

33. The integrated circuit of claim 24, further including a plurality of analog channels and a plurality of respective pins, wherein each analog channel senses a touch event in the ordinary operation mode and senses a stray capacitance in the boundary scan mode independently of the others.

34. The integrated circuit of claim 24, wherein the electronic device is a mobile telephone.

35. The integrated circuit of claim 24, wherein the electronic device is a digital audio player.

36. A method for operating an integrated circuit having a pin and an interface circuit connected thereto, the method comprising:
    placing the interface circuit in boundary scan mode;
    sensing by the interface circuit a stray capacitance present at the pin, the stray capacitance indicative of a state of connection of the integrated circuit;
    placing the interface circuit in an ordinary operation mode; and
    performing a first function related to an ordinary operation of the integrated circuit by the interface circuit.

37. The method of claim 36, further including:
    comparing the sensed stray capacitance to one or more predefined expected capacitance values; and
    determining the state of connection of one or more external elements in relation to the pin based on the comparison, the external elements being external to the integrated circuit.

38. The method of claim 37, wherein each predefined capacitance value indicates a different state of connection, each state of connection indicating which external elements are connected to the pin, if any.

39. The method of claim 38, wherein placing the interface circuit in boundary scan mode, sensing by the interface circuit a stray capacitance, comparing the sensed stray capacitance to expected capacitance values and determining the state of connections are initially performed at a first stage of manufacture at which a first set of external elements are placed in an assembly including the integrated circuit.

40. The method of claim 39, wherein said steps are performed again at a second stage of manufacture, the second stage being such that a second set of external elements are placed in the assembly including the integrated circuit and the first set of elements.

41. The method of claim 36, wherein:
    the integrated circuit is connected to a touch panel;
    the interface circuit is an analog channel;
    the first function includes sensing a touch event at the touch panel by the analog channel; and
    at least a portion of the stray capacitance sensed at the pin is contributed by the touch panel.

42. The method of claim 41, wherein placing the interface circuit in a boundary scan mode further includes:
    sending a stimulation signal to the analog channel; and
    grounding all inputs of the touch panel.

43. The method of claim 42, wherein placing the interface circuit in an ordinary operation mode further includes:
    sending a stimulation signal to the touch panel; and
    sending a reference signal to the analog channel.

44. The method of claim 41, wherein the integrated circuit further includes a plurality of analog channels and a plurality of respective pins connected thereto, and wherein the sensing by the analog channel a stray capacitance present at the pin, and the sensing a touch event at the touch panel are performed in parallel by the plurality of analog channels.

45. The method of claim 44, wherein each analog channel is associated with a respective output electrode of the touch panel.

46. The method of claim 36, wherein the sensing by the interface a stray capacitance includes generating a first signal indicative of the stray capacitance by an amplifier circuit and the performing a first function includes generating a second signal indicative of an external condition by said amplifier circuit.

47. The method of claim 46, wherein the external condition is a touch event on a touch panel.

48. The method of claim 46, wherein the external condition is a hover event on a proximity sensor panel.

49. The method of claim 46, wherein:
    the sensing of a stray capacitance further comprises processing and digitizing the first signal; and
    the performing a first function further comprises processing and digitizing the second signal,
    wherein the processing and digitizing the first and second signals is performed by the same circuitry of the interface circuit.

50. A device comprising:
    an integrated circuit comprising a connection means, and a multimode means connected to the connection means; and
    one or more external elements configurable to form different states of connection in relation to the connection means,
    wherein the multi mode means is configured to operate in an ordinary operation and boundary scan modes, the multi mode means being further configured to:
        in boundary scan mode, obtain a signal indicative of a stray capacitance representative of the connection state of the one or more external elements in relation to the connection means, and
        in ordinary operation mode, perform functions related to the ordinary operation of the device, said functions being distinct from any boundary scan operations.

* * * * *